United States Patent
Davis-Marsh et al.

(10) Patent No.: US 11,152,919 B1
(45) Date of Patent: Oct. 19, 2021

(54) MATHEMATICAL FUNCTION CIRCUIT

(71) Applicant: TEXAS INSTRUMENTS INCORPORATED, Dallas, TX (US)

(72) Inventors: Marc Edric Davis-Marsh, San Jose, CA (US); Hakan Oner, San Jose, CA (US); Tawen Mei, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,576

(22) Filed: Dec. 30, 2020

(51) Int. Cl.
| | |
|---|---|
| H03K 5/22 | (2006.01) |
| H03K 3/012 | (2006.01) |
| H03K 5/24 | (2006.01) |
| H02M 3/155 | (2006.01) |
| H03K 3/017 | (2006.01) |
| G06F 1/26 | (2006.01) |

(52) U.S. Cl.
CPC ............ *H03K 3/012* (2013.01); *H02M 3/155* (2013.01); *H03K 3/017* (2013.01); *H03K 5/24* (2013.01); *G06F 1/26* (2013.01)

(58) Field of Classification Search
CPC ......... G01S 1/02; G01R 19/003; G01R 19/04; G01R 19/16528; G01R 19/16571
USPC ...................................................... 327/63–96
See application file for complete search history.

(56) References Cited

U.S. PATENT DOCUMENTS

| | | | |
|---|---|---|---|
| 2009/0066338 A1* | 3/2009 | Yonezawa | G01R 19/16542 324/426 |
| 2014/0070971 A1* | 3/2014 | Zabroda | G11C 27/026 341/122 |
| 2018/0083608 A1* | 3/2018 | Cho | H03K 5/2481 |

* cited by examiner

*Primary Examiner* — Quan Tra
*Assistant Examiner* — Anh-Quan Tra
(74) *Attorney, Agent, or Firm* — Michael A. Davis, Jr.; Charles A. Brill; Frank D. Cimino

(57) ABSTRACT

An example of an apparatus includes a bias circuit having first and second bias circuit outputs. The apparatus also includes a comparator having first and second comparator inputs. The apparatus also includes a first capacitor coupled between the second comparator input and the second bias circuit output. The apparatus also includes a first switch coupled between the second comparator input and the second bias circuit output. The apparatus also includes a second switch coupled between the first bias circuit output and an input terminal, a third switch coupled between the input terminal and the first comparator input, and a fourth switch coupled between the first bias circuit output and the first comparator input. The apparatus also includes a second capacitor coupled between the first comparator input and the second bias circuit output.

20 Claims, 3 Drawing Sheets

MATHEMATICAL FUNCTION CIRCUIT

BACKGROUND

Based on a control scheme being implemented, certain power converters implement slope compensation that utilizes a duty ratio of the power converter to determine a value of the slope compensation. The duty ratio can be estimated according to worst case input voltage and output voltage value pairs for the power converter (e.g., the most extreme differences between input and output voltages). The slope compensation may be determined based on this estimated duty ratio such that it may be efficient for some ranges of operation of the power converter but not efficient for other ranges of operation of the power converter.

SUMMARY

An example of an apparatus includes a bias circuit having first and second bias circuit outputs. The apparatus also includes a comparator having first and second comparator inputs. The apparatus also includes a first capacitor coupled between the second comparator input and the second bias circuit output. The apparatus also includes a first switch coupled between the second comparator input and the second bias circuit output. The apparatus also includes a second switch coupled between the first bias circuit output and an input terminal, a third switch coupled between the input terminal and the first comparator input, and a fourth switch coupled between the first bias circuit output and the first comparator input. The apparatus also includes a second capacitor coupled between the first comparator input and the second bias circuit output.

An example of an apparatus includes a first input sensing circuit configured to sense a value of a first input voltage and provide a first current that is proportional to the value of the first input voltage. The apparatus also includes a second input sensing circuit configured to sense a value of a second input voltage and provide a second current that is proportional to the value of the second input voltage. The apparatus also includes a comparison circuit. The comparison circuit may be configured to initialize first and second capacitors with respective bias values, charge the first capacitor according to the first current, discharge the second capacitor according to the second current, and sample a value across the first capacitor responsive to the value across the first capacitor being equal to or greater than a value across the second capacitor.

An example of a system includes a power converter and a mathematical calculation circuit. The power converter is configured to receive an input voltage and provide an output voltage proportional to the input voltage. The mathematical calculation circuit is coupled to the power converter and configured to sense a value of the output voltage and provide a first current that is proportional to the value of the output voltage. The mathematical calculation circuit is also configured to sense a value of the input voltage and provide a second current that is proportional to the value of the input voltage. The mathematical calculation circuit is also configured to initialize first and second capacitors with respective bias values, charge the first capacitor according to the first current, and discharge the second capacitor according to the second current. The mathematical calculation circuit is also configured to sample a voltage across the first capacitor responsive to the voltage across the first capacitor being equal to or greater than a voltage across the second capacitor.

DETAILED DESCRIPTION

In some systems, such as direct current (DC) power converters, it may be beneficial to calculate or otherwise determine a duty ratio. For example, in a DC-DC buck power converter that has an input voltage (VIN) of 5 volts (V) and an output voltage (VOUT) of 1 V, the duty ratio may be ⅕, or 0.2. This duty ratio may sometimes be used by the power converter to control slope compensation or other characteristics or elements of operation. In some examples, a fixed value duty ratio is used to control the slope compensation or other characteristics or elements of operation. However, a fixed value duty cycle lacks adaptiveness and therefore may not be able to be optimized for operational conditions of the power converter. For example, slope compensation for a duty ratio of 0.2 may be different than slope compensation for a duty ratio of 0.02. However, if the slope compensation or other characteristics or elements of operation of the power converter are controlled according to a fixed value duty ratio, the slope compensation or other characteristics or elements of operation may not be optimized for an actual duty cycle of the power converter that varies from the fixed value duty cycle. Slope compensation according to a fixed value duty ratio, without including adaptiveness, in at least some examples accommodates extreme ends of a spectrum of combinations of input and output voltages (e.g., ranging those deemed for a circuit to be "best case" to those deemed for the circuit to be "worst case"). This often results in slope compensation that over compensates.

At least some aspects of this description provide for a circuit that determines a duty cycle of a power converter based on VIN and VOUT. The circuit may determine the duty cycle on a cycle-by-cycle basis, recalculating the duty cycle for each new switching cycle of the power converter. Because a duty cycle calculation is a mathematical operation, examples of the described circuit are also capable of performing mathematical calculations unrelated to a duty cycle calculation, such as multiplication or division between two received signals, by changing the value of one or more signals provided to the circuit and without necessitating hardware modification to the circuit. In at least some examples, if VOUT is for some reason unavailable to the circuit, and the circuit is determining a duty cycle of a power converter, references herein to VOUT may be replaced instead by a voltage provided at a switch node of the power converter.

Figure 1:
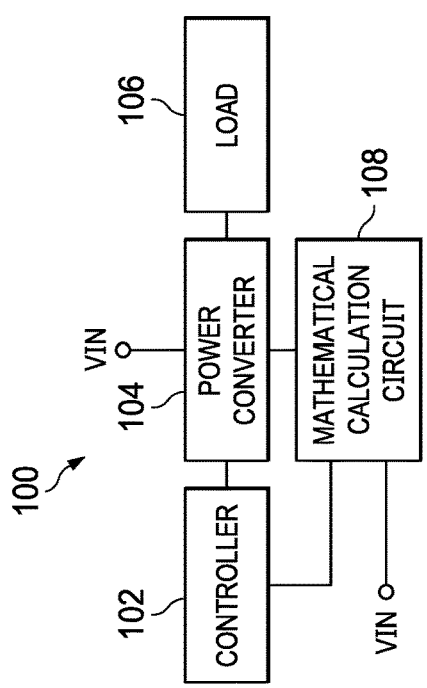
FIG. 1 is a block diagram of an example switched mode power supply.

FIG. 1 is a block diagram of an example system 100. In at least some examples, the system 100 includes a controller 102, a power converter 104, a load 106, and a mathematical calculation circuit 108. The system 100 may be configured to switch power provided to the power converter 104 as VIN to the load 106 to power the load 106. In some implementations, at least some components of the controller 102, the power converter 104, and the mathematical calculation circuit 108 are packaged together as a switched mode power supply (SNIPS). In other examples, at least some components of the controller 102 and the power converter 104 are packaged together as a SMPS and the mathematical calculation circuit 108 is adapted to be coupled to the SMPS.

In at least some implementations, the controller 102 includes components or circuits arranged so as to be suitable for exerting control over the power converter 104. For example, the controller 102 may be a SMPS controller that exerts current mode or voltage mode control over the power converter 104, such as based on one or more received reference signals (not shown) and/or one or more feedback signals (not shown). The power converter 104 may be any suitable power converter topology, including at least buck, boost, and/or buck-boost topologies. In at least some examples, the controller 102 controls the power converter 104 at least partially based on a signal received from the mathematical calculation circuit 108. For example, the mathematical calculation circuit 108 may provide a signal to the controller 102 indicating a calculated or determined duty cycle for the power converter 104, and the controller 102 may control the power converter 104 according to the calculated or determined duty cycle.

Figure 2:
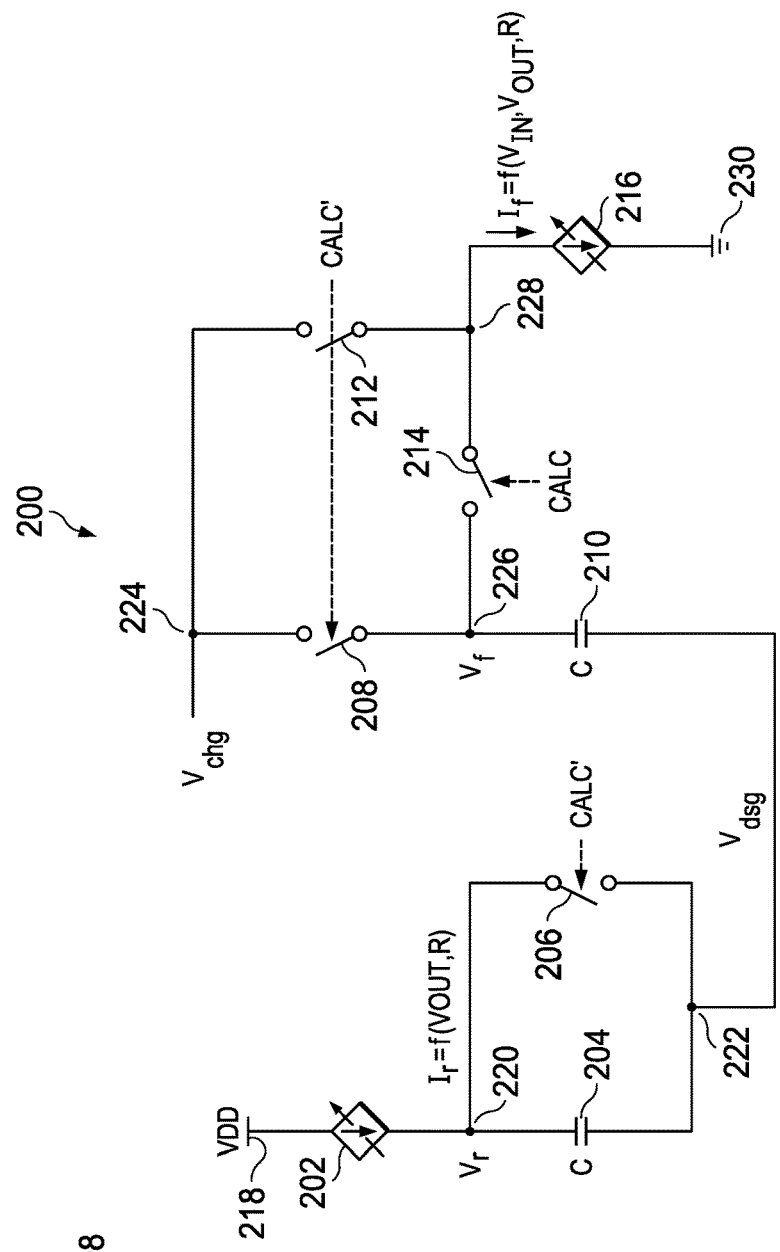
FIG. 2 is a schematic diagram of an example circuit for determining a duty cycle.

FIG. 2 is a schematic diagram of an example circuit 200 for determining a duty cycle. The circuit 200 is, in some examples, suitable for implementation as the mathematical calculation circuit 108 of FIG. 1, described above. In at least some examples, the circuit 200 includes a current source 202, a capacitor 204, a switch 206, a switch 208, a capacitor 210, a switch 212, a switch 214, and a current source 216. The current source 202 is adapted to be coupled between a voltage source 218 and a node 220 and is configured to source current from the voltage source 218 to the node 220. A voltage provided by the voltage source 218, in at least some examples, is VDD. The capacitor 204 and the switch 206 are each coupled between the node 220 and a node 222. The switch 208 is coupled between a node 224 and a node 226. The capacitor 210 is coupled between the node 226 and the node 222. The switch 212 is coupled between the node 224 and a node 228. The switch 214 is coupled between the node 226 and the node 228. The current source 216 is coupled between the node 228 and ground 230 and is configured to sink current from the node 228 to the ground 230.

Operation of the circuit 200 is, in at least some examples, controlled according to a calculate signal (CALC). In at least some examples, the switch 206, switch 208, and the switch 212 are each controlled according to an inverse of CALC (abbreviated as CALC') and the switch 214 is controlled according to CALC. CALC is, in some examples, a logic-level signal defined as having an asserted value or state and a de-asserted value or state. For example, responsive to CALC being asserted, the switches 206, 208, and 212 are opened and the switch 214 is closed. Conversely, responsive to CALC being de-asserted, the switches 206, 208, and 212 are closed and the switch 214 is opened. In at least some examples, responsive to CALC being asserted, operation of the circuit 200 is initiated. CALC is asserted, in some examples, on command such as by another circuit or component (not shown) responsive to a condition precedent occurring. In other examples, CALC is asserted at some periodic frequency or based on a recurring timer. In yet other examples, such as if the circuit 200 is implemented to determine a duty cycle of a component of a power converter (e.g., such as the power converter 104), as described elsewhere herein, a relationship exists between CALC and a control signal associated with the component of the power converter. In yet other examples, assertion of CALC is synchronized to a clock of a system in which the circuit 200 is implemented, such as to prevent operation of the circuit 200 from being asynchronous.

In an example of operation of the circuit 200, bias voltage $V_{chg}$ is provided at the node 224 and bias voltage $V_{dsg}$ is provided at the node 222. Responsive to CALC being de-asserted, the capacitor 204 is initialized to a voltage of about 0 V. Similarly, the capacitor 210 is initialized to a voltage of about 2 V. Responsive to CALC becoming asserted, the current source 202 charges the capacitor 204 with a current of $I_r$, which is a function of VOUT and R (noted as f(VOUT,R)), such as about VOUT/R. Similarly, the current source 216 discharges the capacitor 210 at a rate of $I_f$, which is a function of VIN, VOUT, and R (noted as f(VIN,VOUT,R)), such as about (VIN−VOUT)/R. Responsive to a voltage across the capacitor 204 being approximately equal to a voltage across the capacitor 210, the voltage across the capacitor 204 is sampled. This sampled voltage is the determined duty cycle based on VIN and VOUT.

Figure 3:
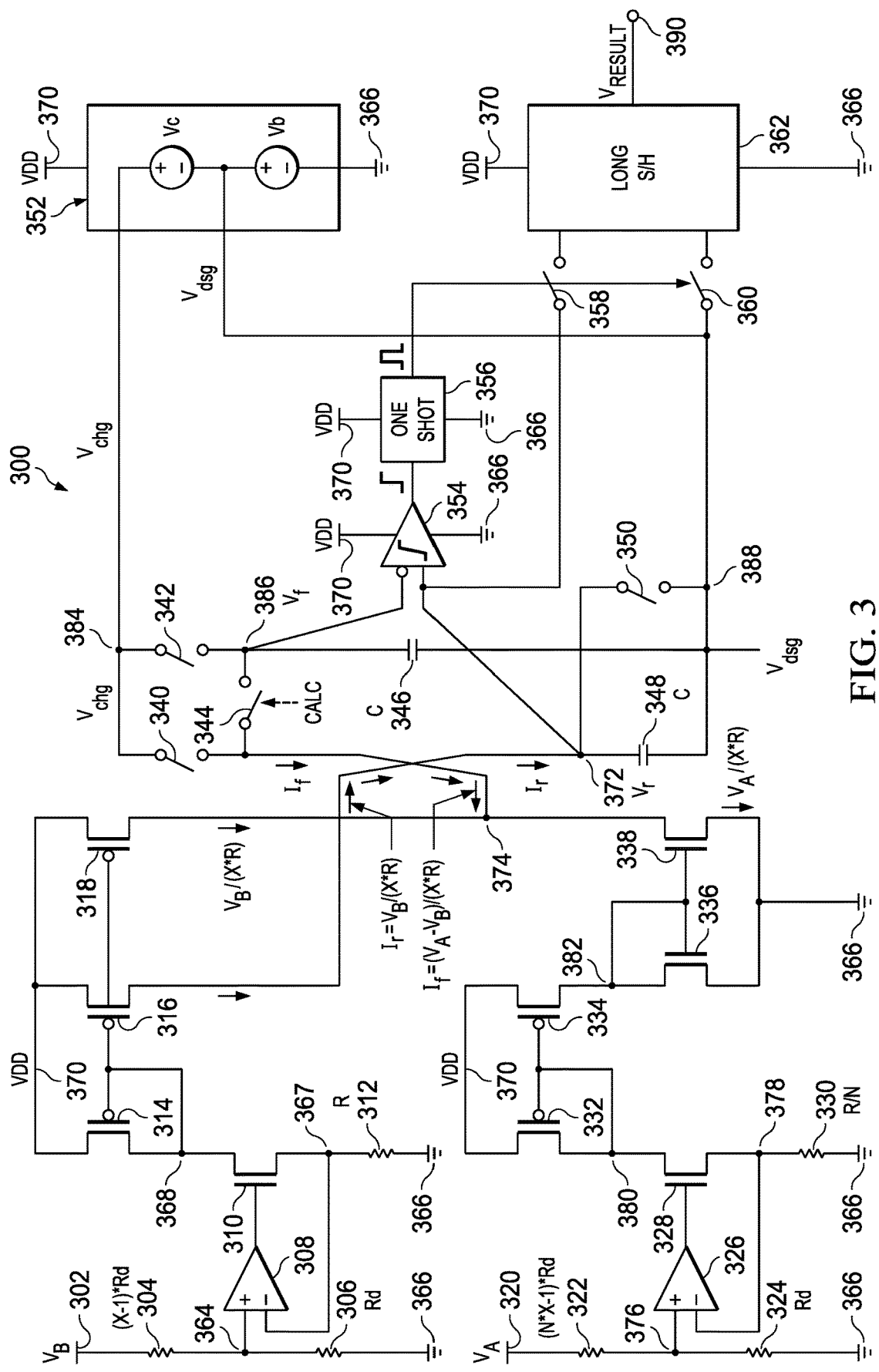
FIG. 3 is a schematic diagram of an example circuit for performing mathematical operations.

FIG. 3 is a schematic diagram of an example circuit 300 for performing mathematical operations. In at least some examples, the circuit 300 is one example of a transistor-level implementation of the mathematical calculation circuit 108 of FIG. 1 and/or the circuit 200 of FIG. 2. In at least one example, the circuit 300 includes a resistor 304 and a resistor 306, an amplifier 308, a transistor 310, a resistor 312, a transistor 314, a transistor 316, and a transistor 318. The circuit 300 also includes a resistor 322 and a resistor 324, an amplifier 326, a transistor 328, a resistor 330, a transistor 332, a transistor 334, a transistor 336, and a transistor 338. The circuit 300 also includes a switch 340, switch 342, switch 344, and capacitor 346. The circuit 300 also includes a capacitor 348, a switch 350, a bias circuit 352, a comparator 354, a one-shot pulse generator 356, a switch 358, a switch 360, and a sample and hold circuit 362.

In an example architecture of the circuit 300, the resistor 304 is coupled between a voltage source 302 and a node 364. The resistor 306 is coupled between the node 364 and ground 366. The amplifier 308 has a non-inverting input coupled to the node 364 and an inverting input coupled to a node 367. An output of the amplifier 308 is coupled to a gate of the transistor 310. A source of the transistor 310 is coupled to the node 367 and a drain of the transistor 310 is coupled to a node 368. The resistor 312 is coupled between the node 367 and ground 366. The transistor 314 has a gate and a drain coupled to the node 368 and a source coupled to a voltage source 370. The transistor 316 has a gate coupled to the node 368, a drain coupled to a node 372, and a source coupled to the voltage source 370. The transistor 318 has a gate coupled to the node 368, a drain coupled to a node 374, and a source coupled to the voltage source 370.

Continuing the example architecture of the circuit 300, the resistor 322 is coupled between a voltage source 320 and a node 376. The resistor 324 is coupled between the node 376 and ground 366. The amplifier 326 has a non-inverting input coupled to the node 376 and an inverting input coupled to a node 378. An output of the amplifier 326 is coupled to a gate of the transistor 328. A source of the transistor 328 is coupled to the node 378 and a drain of the transistor 328 is coupled to a node 380. The resistor 330 is coupled between the node 378 and ground 366. The transistor 332 has a gate and a drain coupled to the node 380 and a source coupled to the voltage source 370. The transistor 334 has a gate coupled to the node 380, a drain coupled to a node 382, and a source coupled to the voltage source 370. The transistor 336 has a gate and drain coupled to the node 382 and a source coupled to ground 366. The transistor 338 has a gate coupled to the node 382, a drain coupled to the node 374, and a source coupled to ground 366.

Continuing the example architecture of the circuit 300, the switch 340 is coupled between a node 384 and the node 374. The switch 342 is coupled between the node 384 and a node 386. The switch 344 is coupled between the node 374 and the node 386. The capacitor 346 is coupled between the node 386 and a node 388. The capacitor 348 and the switch 350 are each coupled between the node 372 and the node 388. The bias circuit 352 is coupled between the voltage source 370 and ground 366 and has a first output coupled to the node 384 and a second output coupled to the node 388. The comparator 354 has a first input (e.g., a negative or inverting input) coupled to the node 386 and a second input (e.g., positive or non-inverting input) coupled to the node 372. An output of the comparator 354 is coupled to an input of the one-shot pulse generator 356. The switch 358 is coupled between the node 372 and a first input of the sample and hold circuit 362. The switch 360 is coupled between the node 388 and a second input of the sample and hold circuit 362. The sample and hold circuit 362 is coupled between the voltage source 370 and ground 366 and has an output coupled to a node 390.

In at least some examples, the voltage source 302 has a voltage of VB, the resistor 304 has a resistance of $(X-1)*Rd$, the resistor 306 has a resistance of Rd, and the resistor 312 has a resistance of R. In at least some examples, X has any suitable value at least partially based on a dynamic range of VB to adapt the voltage divider formed by the resistor 304 and the resistor 306 to a common mode range of the amplifier 308. The voltage source 320 has a voltage of VA, the resistor 322 has a resistance of $(N*X-1)*Rd$, the resistor 324 has a resistance of Rd, and the resistor 330 has a resistance or R/N. In at least some examples, N has any suitable value at least partially based on a dynamic range of VA to adapt the voltage divider formed by the resistor 322 and the resistor 324 to a common mode range of the amplifier 326. Also, in at least some examples, the amplifier 308 and the amplifier 326 have a substantially same common mode range. The voltage source 370 has a value of VDD, which is any value suitable for providing power for operation of components of the circuit 300. In at least some examples, a current $(I_r)$ having a value approximately equal to $V_B/(X*R)$ flows through the transistor 316 and the transistor 318 and a current having a value approximately equal to $V_A/(X*R)$ flows through the transistor 338. The capacitor 346 and the capacitor 348 each have a capacitance of C. A voltage $V_r$ exists at the node 372 and a voltage $V_f$ exists at the node 386. The bias circuit 352 provides a bias voltage VC+Vb as a signal $V_{chg}$, in at least some examples derived from VDD, at the node 384 and a bias voltage Vb as a signal $V_{dsg}$, also in at least some examples derived from VDD, at the node 388. An output of the circuit 300, indicated as $V_{RESULT}$, is provided at the node 390.

In an example of operation of the circuit 300, $V_B$ is sensed from the voltage source 302 and passed through a voltage divider formed by the resistor 304 and the resistor 306 to provide an output of the voltage divider at the node 364. The amplifier 308, transistor 310, and resistor 312 together form a voltage-to-current (V-I) converter that provides a current flowing through the node 368 that is proportional to $V_B$. The transistor 314 and the transistor 316, as well as the transistor 314 and the transistor 318, form current mirrors that mirror the current flowing through the node 368 to the nodes 372 and 374, respectively. Similarly, $V_A$ is sensed from the voltage source 320 and passed through a voltage divider formed by the resistor 322 and the resistor 324 to provide an output of the voltage divider at the node 376. The amplifier 326, transistor 328, and resistor 330 together form a V-I converter that provides a current flowing through the node 380 that is proportional to $V_A$. The transistor 332 and the transistor 334 form a current mirror that mirrors the current flowing through the node 380 to the node 382. The transistor 336 and the transistor 338 form a current mirror that mirrors the current flowing through the node 382 to the node 374 such that according to current summation rules, a current $(I_f)$ flowing through the node 374 is approximately equal to $(V_A-V_B)/(X*R)$.

The switch 340, switch 342, and switch 350 are each controlled according to CALC' and the switch 344 is controlled according to CALC. For example, responsive to CALC being asserted, the switches 340, 342, and 350 are opened and the switch 344 is closed. Conversely, responsive to CALC being de-asserted, the switches 340, 342, and 350 are closed and the switch 344 is opened. Also responsive to CALC being de-asserted, in at least some examples, the capacitor 346 is initialized according to $V_{chg}$ and the capacitor 348 is initialized according to $V_{dsg}$. In some examples, the capacitor 346 is initialized to a value of about 1 V according to $V_{chg}$ and the capacitor 348 is initialized to about 0 V according to $V_{dsg}$.

Responsive to CALC being asserted, the capacitor 346 is discharged from its initialized value at a rate approximately equal to the current flowing through the node 374 (in at least some examples, approximately $(V_A-V_B)/(X*R)$). Similarly, responsive to CALC being asserted, the capacitor 348 is charged from its initialized value at a rate approximately equal to the current flowing through the node 372 (in at least some examples, approximately $V_B/(X*R)$). The comparator 354 compares voltages of the capacitor 346 and the capacitor 348, as represented by $V_f$ and $V_r$, respectively. Responsive to $V_r$ increasing to equal or exceed $V_f$ an output signal of the comparator 354 becomes asserted. Responsive to the output signal of the comparator 354 becoming asserted (e.g., at a rising edge of the output signal of the comparator 354) the one-shot pulse generator 356 provides a pulse width modulation (PWM) signal pulse having a programmed duration. The duration of the PWM signal pulse may be any suitable duration.

In at least some examples, the PWM signal pulse controls the switches 358 and 360. For example, responsive to the PWM signal pulse being asserted, the switches 358 and 360 are closed and responsive to the PWM signal pulse being de-asserted, the switches 358 and 360 are opened. Responsive to the switches 358 and 360 being closed, the sample and hold circuit 362 samples a voltage across the capacitor 348 (e.g., $V_r$ and $V_{dsg}$). The sample and hold circuit 362 provides a value at the node 390 representing the voltage across the capacitor 348. The value is, in some examples, $V_{RESULT}$ and is an output of the circuit 300. After determining $V_{RESULT}$, the circuit 300 may be reset by de-asserting CALC such that the capacitor 346 and the capacitor 348 are each re-initialized.

In some examples, by controlling values of $V_A$, $V_B$, and $V_C$, various mathematical functions may be implemented by the circuit 300. For example, responsive to $V_A$ being equal to VIN, $V_B$ is equal to VOUT, and $V_C$ is 1 V, $V_{RESULT}$, ranging from 0 V to 1 V, represents a duty cycle of the power converter corresponding to VIN and VOUT. More generally, responsive to $V_A$ having a value of 1 V, $V_{RESULT}$ is approximately equal to a product of a multiplication of $V_B$ and $V_C$. Similarly, responsive to $V_C$ having a value of 1 V, $V_{RESULT}$ is approximately equal to a quotient of a division of $V_B$ by $V_A$, or if $V_B$ has a value of 1 V, $V_{RESULT}$ is approximately equal to a quotient of a division of $V_C$ by $V_A$.

Figure 4:
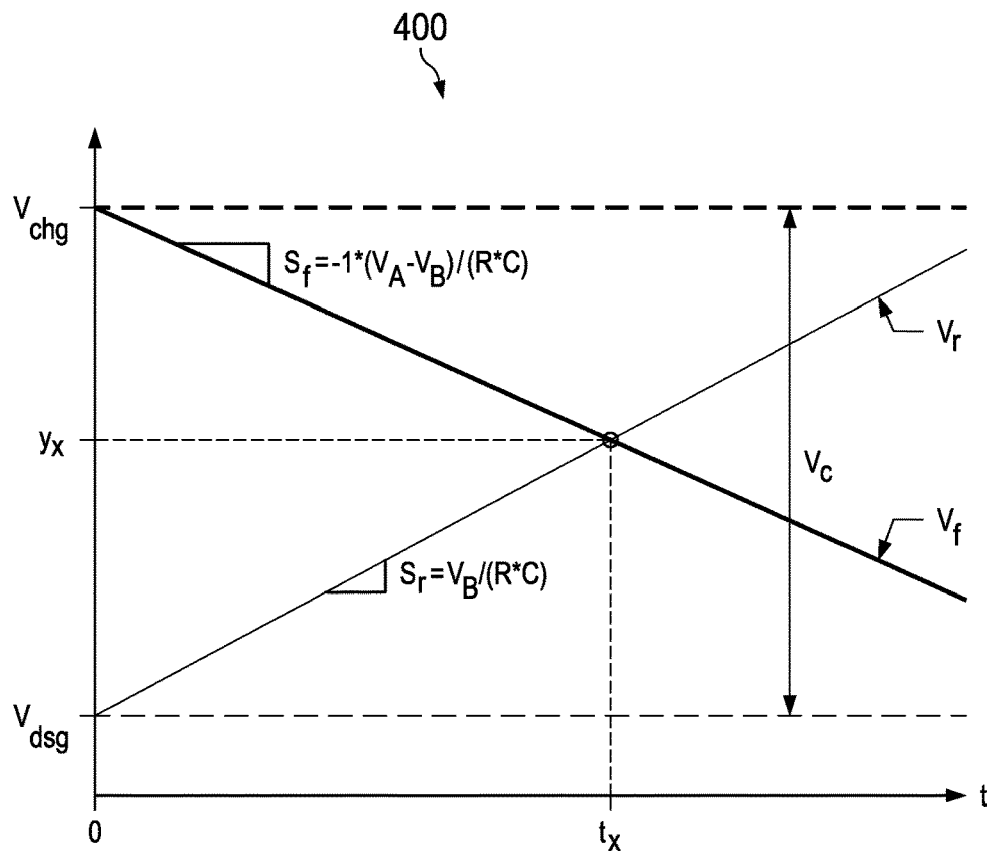
FIG. 4 is a diagram of example signal waveforms.

FIG. 4 is a diagram 400 of example signal waveforms. In at least some examples, the signals $V_{chg}$, $V_{dsg}$, $V_r$, and $V_f$ as described above with respect to FIG. 3 are shown in the diagram 400. The diagram 400 also shows a slope of $V_r$ (labeled $S_r$), a slope of $V_f$ (labeled $S_r$), and the value $V_C$. A horizontal axis of the diagram 400 is representative of time and a vertical axis of the diagram 400 is representative of voltage. As shown by the diagram 400, at a time $t_x$, $V_r$ increases in value to approximately equal, or exceed, a value of $V_f$. $t_x$ is approximately equal to $((R*C)/V_A)*V_C$. At $t_x$, a value of $V_r$ (labeled $y_x$) is sampled and is approximately equal to $V_{dsg}+((V_B*V_C)/V_A)$, which simplifies to $(V_B*V_C)/V_A$ if $V_{dsg}$ is 0 V as described above with respect to FIG. 3.

Figure 5:
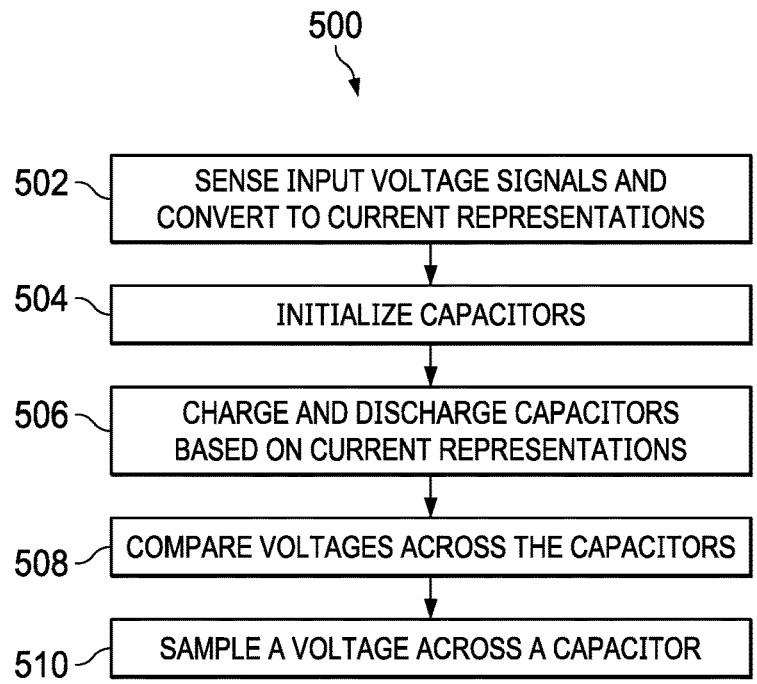
FIG. 5 is a flowchart of an example method.

FIG. 5 is a flowchart of an example method 500. In at least some examples, the method 500 is a method for performing hardware-based mathematical calculations, including at least multiplication and division, which can include calculation of a power converter duty cycle if inputs to the method 500 are signals associated with a power converter. In at least some examples, the method 500 is implemented at least in part by a circuit such as the circuit 300 of FIG. 3.

At operation 502, first and second input voltage signals are sensed and converted to current representations that are proportional to the respective input voltage signals. For example, the first and second input voltage signals may each be sensed from a voltage source, passed through a voltage divider, and converted to a current representation by a V-I converter. The current representation may be mirrored from one node to another node in the circuit.

At operation 504, capacitors are initialized. For example, a first capacitor may be initialized to a first bias value and a second capacitor may be initialized to a second bias value. The capacitors may be initialized by charging, or discharging, them until a target capacitor voltage is reached. In some examples, the first bias value is 1 V and the second bias value is 0 V. In other examples, the first and second bias values may be any suitable value(s) based on a target function or mathematical operation of the circuit.

At operation 506, at least some of the capacitors are charged based on the current representation of the first input voltage signal and at least some of the capacitors are discharged based on the current representation of the second input voltage signal. For example, a first capacitor that was initialized to a non-zero value may be discharged based on the current representation of the second input voltage signal and a second capacitor that was initialized to value of approximately zero may be charged based on the current representation of the first input voltage signal.

At operation 508, voltages across the capacitors are compared. For example, a voltage across the first capacitor may be compared to a voltage across the second capacitor to determine whether the value of the second capacitor voltage equals or exceeds the value of the first capacitor voltage. The method 500 may remain at operation 508 until the value of the second capacitor equals or exceeds the value of the first capacitor, responsive to which the method 500 may proceed to operation 510.

At operation 510, a voltage across the second capacitor may be sampled. The voltage across the second capacitor as sampled at approximately a time at which the voltage across the second capacitor equals or exceeds the voltage across the first capacitor is, in some examples, an output of the circuit. The output of the circuit is, in some examples, representative of a duty cycle of a power converter associated with the first and second input voltage signals. In other examples, the output of the circuit is a result of a mathematical calculation or operation that the circuit was configured to perform based on values of one or more of the first or second input voltage signals, the first bias value, and/or the second bias value.

While the operations of the method 500 described herein have been described and labeled with numerical reference, in various examples, the method 500 includes operations that are not recited herein. In some examples, any one or more of the operations recited herein include one or more sub-operations. In some examples, any one or more of the operations recited herein is omitted. In some examples, any one or more of the operations recited herein is performed in an order other than that presented herein (e.g., in a reverse order, substantially simultaneously, overlapping, etc.). Each of these alternatives falls within the scope of this description.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described examples, and other examples are possible, within the scope of the claims.

What is claimed is:

1. An apparatus, comprising:
a bias circuit having first and second bias circuit outputs;
a comparator having first and second comparator inputs;
a first capacitor coupled between the second comparator input and the second bias circuit output;
a first switch coupled between the second comparator input and the second bias circuit output;
a second switch coupled between the first bias circuit output and an input terminal;
a third switch coupled between the input terminal and the first comparator input;
a fourth switch coupled between the first bias circuit output and the first comparator input; and
a second capacitor coupled between the first comparator input and the second bias circuit output.

2. The apparatus of claim 1, wherein the comparator has a comparator output, and wherein the apparatus further comprises:
a pulse generation circuit having a pulse generation output and a pulse generation input, the pulse generation input coupled to the comparator output;
a sample and hold circuit having first and second sample and hold inputs;
a fifth switch coupled between the second comparator input and the first sample and hold input; and
a sixth switch coupled between the second bias circuit output and the second sample and hold input, wherein the fifth switch and the sixth switch each have control inputs coupled to the pulse generation output.

3. The apparatus of claim 2, wherein the sample and hold circuit is configured to sample a value across the first capacitor responsive to a value of the first capacitor being equal to or greater than a value of the second capacitor.

4. The apparatus of claim 1, wherein the bias circuit is configured to initialize the first capacitor and the second capacitor with respective bias values, and wherein those bias values at least partially define a mathematical operation performed by the circuit.

5. The apparatus of claim 1, further comprising:
an amplifier having an amplifier output and first and second amplifier inputs;
a first resistor adapted to be coupled between a first voltage source and the first amplifier input;
a second resistor coupled between the first amplifier input and ground;
a first transistor having a first transistor gate, a first transistor drain, and a first transistor source, the first transistor gate coupled to the amplifier output and the first transistor source coupled to the second amplifier input;
a third resistor coupled between the second amplifier input and ground;
a second transistor having a second transistor gate, a second transistor drain, and a second transistor source, the second transistor gate and the second transistor drain coupled to the first transistor drain and the second transistor source adapted to be coupled to a second voltage source;
a third transistor having a third transistor gate, a third transistor drain, and a third transistor source, the third transistor gate coupled to the first transistor drain, the third transistor drain coupled to the second comparator input, and the third transistor source adapted to be coupled to the second voltage source; and
a fourth transistor having a fourth transistor gate, a fourth transistor drain, and a fourth transistor source, the fourth transistor gate coupled to the first transistor drain, the fourth transistor drain coupled to the input terminal, and the fourth transistor source adapted to be coupled to the second voltage source.

6. The apparatus of claim 5, further comprising:
a second amplifier having a second amplifier output and second amplifier first and second inputs;
a fourth resistor adapted to be coupled between a third voltage source and the second amplifier first input;
a fifth resistor coupled between the second amplifier first input and ground;
a fifth transistor having a fifth transistor gate, a fifth transistor drain, and a fifth transistor source, the fifth transistor gate coupled to the second amplifier output and the fifth transistor source coupled to the second amplifier second input;
a sixth resistor coupled between the second amplifier second input and ground;
a sixth transistor having a sixth transistor gate, a sixth transistor drain, and a sixth transistor source, the sixth transistor gate and the sixth transistor drain coupled to the fifth transistor drain and the sixth transistor source adapted to be coupled to the second voltage source;
a seventh transistor having a seventh transistor gate, a seventh transistor drain, and a seventh transistor source, the seventh transistor gate coupled to the fifth transistor drain and the third transistor source adapted to be coupled to the second voltage source;
an eighth transistor having an eighth transistor gate, an eighth transistor drain, and an eighth transistor source, the eighth transistor gate and the eighth transistor drain coupled to the seventh transistor drain and the eighth transistor source coupled to ground; and
a ninth transistor having a ninth transistor gate, a ninth transistor drain, and a ninth transistor source, the ninth transistor gate coupled to the seventh transistor drain, the ninth transistor drain coupled to the input terminal, and ninth transistor source coupled to ground.

7. The apparatus of claim 1, wherein the third switch is configured to be controlled by a control signal, and wherein the first switch, the second switch, and the third switch are configured to be controlled by an inverse of the control signal.

8. An apparatus, comprising:
a first input sensing circuit configured to sense a value of a first input voltage and provide a first current that is proportional to the value of the first input voltage;
a second input sensing circuit configured to sense a value of a second input voltage and provide a second current that is proportional to the value of the second input voltage; and
a comparison circuit configured to:
initialize first and second capacitors with respective bias values;
charge the first capacitor according to the first current;

discharge the second capacitor according to the second current; and sample a value across the first capacitor responsive to the value across the first capacitor being equal to or greater than a value across the second capacitor.

9. The apparatus of claim 8, wherein the comparison circuit includes:
a bias circuit having first and second bias circuit outputs;
a comparator having first and second comparator inputs;
a first capacitor coupled between the second comparator input and the second bias circuit output;
a first switch coupled between the second comparator input and the second bias circuit output;
a second switch coupled between the first bias circuit output and an input terminal;
a third switch coupled between the input terminal and the first comparator input;
a fourth switch coupled between the first bias circuit output and the first comparator input; and
a second capacitor coupled between the first comparator input and the second bias circuit output.

10. The apparatus of claim 9, wherein the comparator has a comparator output, and wherein the comparison circuit includes:
a pulse generation circuit having a pulse generation output and a pulse generation input, the pulse generation input coupled to the comparator output;
a sample and hold circuit having first and second sample and hold inputs;
a fifth switch coupled between the second comparator input and the first sample and hold input; and
a sixth switch coupled between the second bias circuit output and the second sample and hold input, wherein the fifth switch and the sixth switch each have control inputs coupled to the pulse generation output.

11. The apparatus of claim 10, wherein the comparator is configured to compare the voltage across the first capacitor to the voltage across the second capacitor and to provide a comparison result having an asserted value responsive to the voltage across the first capacitor being equal to or greater than the voltage across the second capacitor.

12. The apparatus of claim 11, wherein the pulse generation circuit is configured to provide a single-pulse pulse width modulation (PWM) signal responsive to the comparison result becoming asserted.

13. The apparatus of claim 10, wherein the bias circuit is configured to initialize the first capacitor and the second capacitor with the respective bias values, and wherein those bias values at least partially define a mathematical operation performed by the circuit.

14. The apparatus of claim 9, wherein the sampled voltage across the first capacitor is a duty cycle of a power converter configured to provide an output voltage that is the first input voltage and configured to provide an input voltage that is the second input voltage.

15. The apparatus of claim 9, wherein the first capacitor and the second capacitor are configured to be initialized responsive to the third switch being controlled to be open and the first switch, the second switch, and the third switch being controlled to be closed.

16. A system, comprising:
a power converter configured to receive an input voltage and provide an output voltage proportional to the input voltage; and
a mathematical calculation circuit coupled to the power converter and configured to:
sense a value of the output voltage and provide a first current that is proportional to the value of the output voltage;
sense a value of the input voltage and provide a second current that is proportional to the value of the input voltage;
initialize first and second capacitors with respective bias values;
charge the first capacitor according to the first current;
discharge the second capacitor according to the second current; and
sample a voltage across the first capacitor responsive to the voltage across the first capacitor being equal to or greater than a voltage across the second capacitor.

17. The system of claim 16, wherein the mathematical calculation circuit is configured to compare the voltage across the first capacitor to the voltage across the second capacitor and provide a comparison result having an asserted value responsive to the voltage across the first capacitor being equal to or greater than the voltage across the second capacitor.

18. The system of claim 16, wherein the mathematical calculation circuit is configured to provide a single-pulse pulse width modulation (PWM) signal responsive to the comparison result becoming asserted.

19. The system of claim 16, wherein the sampled voltage across the first capacitor is a duty cycle of the power converter.

20. The system of claim 16, wherein the mathematical calculation circuit includes:
a bias circuit having first and second bias circuit outputs;
a comparator having a comparator output and first and second comparator inputs;
the first capacitor, coupled between the second comparator input and the second bias circuit output;
a first switch coupled between the second comparator input and the second bias circuit output;
a second switch coupled between the first bias circuit output and an input terminal;
a third switch coupled between the input terminal and the first comparator input;
a fourth switch coupled between the first bias circuit output and the first comparator input;
the second capacitor, coupled between the first comparator input and the second bias circuit output;
a pulse generation circuit having a pulse generation output and a pulse generation input, the pulse generation input coupled to the comparator output;
a sample and hold circuit having first and second sample and hold inputs;
a fifth switch coupled between the second comparator input and the first sample and hold input; and
a sixth switch coupled between the second bias circuit output and the second sample and hold input, wherein the fifth switch and the sixth switch each have control inputs coupled to the pulse generation output.

* * * * *